(12) United States Patent
Nad et al.

(10) Patent No.: US 12,074,102 B2
(45) Date of Patent: Aug. 27, 2024

(54) STRUCTURAL ELEMENTS FOR APPLICATION SPECIFIC ELECTRONIC DEVICE PACKAGES

(71) Applicant: Intel Corporation, Santa Clara, CA (US)

(72) Inventors: Suddhasattwa Nad, Chandler, AZ (US); Ravindranath Mahajan, Chandler, AZ (US); Brandon Marin, Chandler, AZ (US); Jeremy Ecton, Gilbert, AZ (US); Mohammad Mamunur Rahman, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 1008 days.

(21) Appl. No.: 16/827,085

(22) Filed: Mar. 23, 2020

(65) Prior Publication Data
US 2021/0296225 A1   Sep. 23, 2021

(51) Int. Cl.
*H01L 23/00* (2006.01)
*H01L 23/50* (2006.01)
*H01L 23/538* (2006.01)
*H01L 29/06* (2006.01)
*H01L 23/40* (2006.01)

(52) U.S. Cl.
CPC .......... *H01L 23/50* (2013.01); *H01L 23/5383* (2013.01); *H01L 29/0649* (2013.01); *H01L 2023/4031* (2013.01)

(58) Field of Classification Search
CPC .... H01L 23/50; H01L 23/5383; H01L 23/562
See application file for complete search history.

(56) References Cited

U.S. PATENT DOCUMENTS

| | | | |
|---|---|---|---|
| 2012/0235303 A1* | 9/2012 | Liu | H01L 23/49822 257/E23.068 |
| 2016/0035591 A1* | 2/2016 | Huang | H01L 24/81 438/126 |
| 2016/0085899 A1* | 3/2016 | Qian | H01L 23/5383 257/774 |

(Continued)

OTHER PUBLICATIONS

"Distal." Merriam-Webster.com. 2023. https://www.merriam-webster.com/dictionary/distal (Aug. 10, 2023). (Year: 2023).*

(Continued)

*Primary Examiner* — Reema Patel
(74) *Attorney, Agent, or Firm* — Essential Patents Group, LLP

(57) ABSTRACT

An integrated circuit package comprising an integral structural member embedded within dielectric material and at least partially surrounding a keep-out zone of a co-planar package metallization layer. The integral structural member may increase stiffness of the package without increasing the package z-height. The structural member may comprise a plurality of intersecting elements. Individual structural elements may comprise conductive vias that are non-orthogonal to a plane of the package. An angle of intersection and thickness of the structural elements may be varied to impart more or less local or global rigidity to a package according to a particular package application. Intersecting openings may be patterned in a mask material by exposing a photo-sensitive material through a half-penta prism. Structural material may be plated or otherwise deposited into the intersecting openings.

19 Claims, 13 Drawing Sheets

(56) References Cited

OTHER PUBLICATIONS

"Proximal." Merriam-Webster.com. 2023. https://www.merriam-webster.com/dictionary/proximal (Aug. 10, 2023). (Year: 2023).*

* cited by examiner

STRUCTURAL ELEMENTS FOR APPLICATION SPECIFIC ELECTRONIC DEVICE PACKAGES

BACKGROUND

Warpage has been a challenge in the fabrication of thin integrated circuit (IC) device packages. Temperature coefficients of thermal expansion (CTE) may differ between a device and a package substrate, which may contribute to the problem of warpage. Thermal processing, such as a solder reflow process, may also contribute to a significant amount of warpage, which in turn can cause opens in circuitry, resulting in loss of yield and reduced reliability of a packaged device. Increasing package stiffness is one means of reducing warpage, but imparting greater stiffness to thinner package form factors demanded by light mobile and ultra-mobile applications is difficult.

FIG. 1 is an isometric view illustrating a conventional microelectronic device package assembly 100. Package assembly 100 includes IC die 105 and 110 attached to a surface of package 120. Although not depicted, package 120 may include one or more levels of metallization embedded within one or more dielectric materials. A stiffener 140 is attached to the top surface of package 120, attached, for example, by an adhesive, to a perimeter portion of package 120 beyond a keep-out zone demarked in FIG. 1 by dashed boundary line 130. IC die 105 and IC die 110, as well as any chip-side components (e.g., capacitors, etc.) are limited to an area within an interior of the keep-out zone boundary line 130. Stiffener 140, may be a stamped metal preform, for example, and can increase the stiffness of package assembly 100. However, stiffener 140 requires a substantial increase in package assembly z-height. For example, where package 120 has a thickness T1, and stiffener 140 has a thickness T2, the package assembly may have a z-height (or thickness) T3 that is approximately a sum of T1 and T2.

In some package assemblies, particularly those having at least one IC chip embedded within a package, it may be advantageous for rigidity to vary across an area of the package. Yet as a preform, a full-package solution like stiffener 140 cannot provide localized control over the package rigidity so that stiffener 140 cannot fully address micro-reliability concerns. Another problem with attaching stiffener 140 to the top of package 120 is that such parts, sourced from a supply chain, increase packaging unit costs and time-to-market as a re-design and/or re-qualification may be needed each time a product is introduced. Finally, a top-side stiffener of the type depicted in FIG. 1 limits the locations and available package area for die side probe pads, components and other functional features of the assembly.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
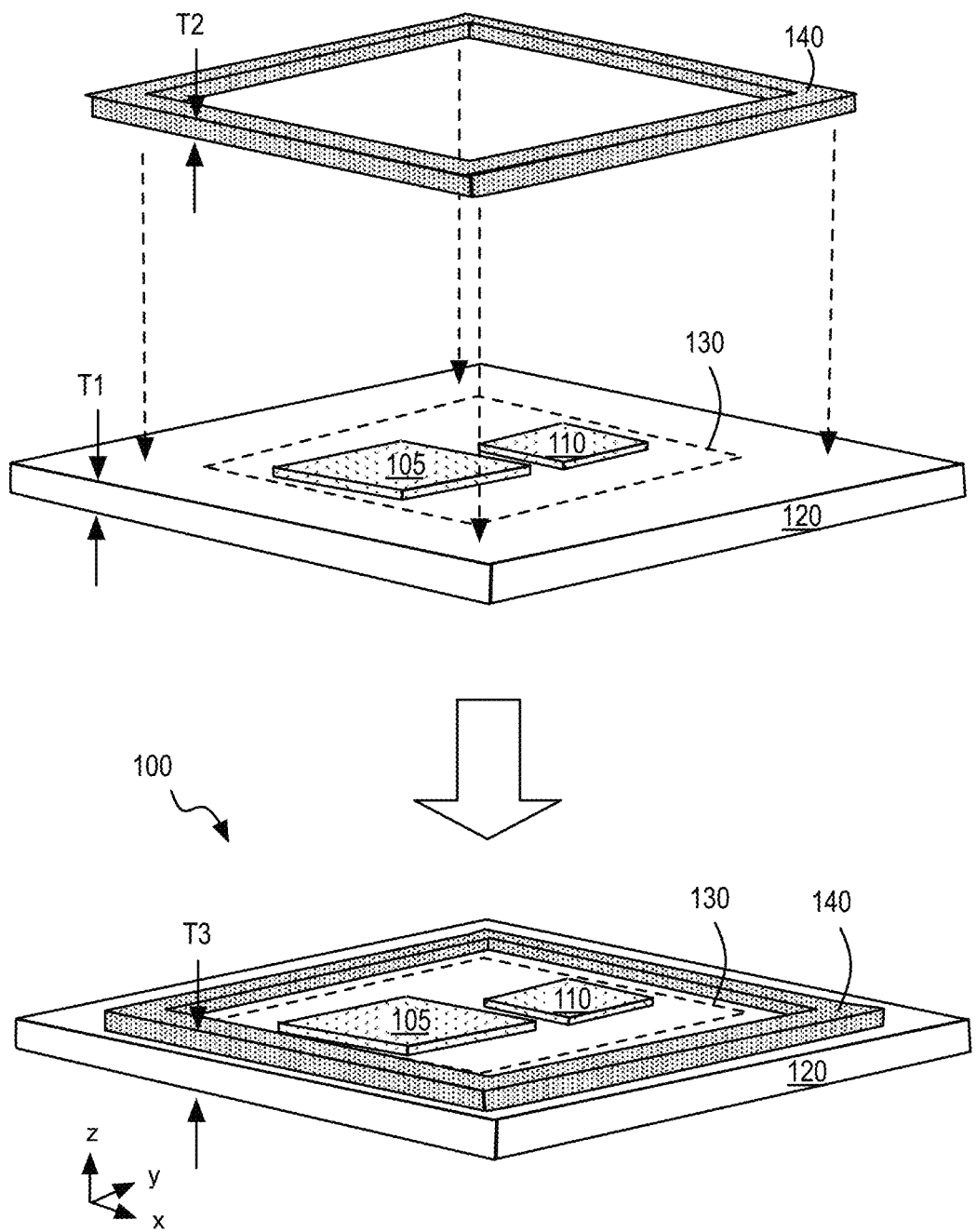
FIG. 1 illustrates an isometric view of a conventional microelectronic device package assembly.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material disposed over or under another may be directly in contact or may have one or more intervening materials. Moreover, one material disposed between two materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A: B: C: A and B: A and C: B and C: or A, B and C.

In accordance with some embodiments herein, a structural member is integrated into a cored or a coreless package architecture. The integral structural member may be embedded within package dielectric material and may further occupy a portion of a keep-out zone of a package metallization layer that may be co-planar to the structural member. The structural member may be a contiguous frame about a perimeter of the package. Being integral to the package, the structural member need not incur any z-height overhead. The structural member may be of a material having a higher elastic (e.g., Young's) modulus than the package dielectric material and may be dimensioned to increase stiffness of the package either locally within only a specific region of the package, or globally over the entire package area. A package may include a plurality of structural members within one package metallization level, and/or may include at least one structural member in each of a plurality of package metallization levels.

As further described below, a structural member may comprise one or more structural components, each component within a different plane of the package. A structural component may further include one or more structural elements. Individual structural elements may comprise intersecting conductive vias that are non-orthogonal to a plane of the package so that they intersect at an angle, for example with the cross-sectional profile being a alternating chevron or zigzag structure. Being fabricated as a portion of the substrate, the angle of intersection and thickness of the structural elements may be varied as needed to impart more or less rigidity to a package according to a particular package application. For example, a package that is to remain flexible may be stiffened by a greater amount in a region proximal to where an IC die is to be attached. Hence, the angle of intersection and/or thickness of the structural elements may be varied within a contiguous structural member. Or a structural member may be located within a package area so as to limit the stiffness imparted by the structural member to only a portion of the package.

The integral structural members described herein are compatible with semi-additive processes (SAP) or modified SAP (mSAP) package fabrication techniques. As described further below, intersecting openings may be patterned in a mask material by exposing a photosensitive material through a half-penta prism. Structural material, such as copper, may be plated or otherwise deposited into the intersecting openings. Other structural materials, such as silicon, might also be employed, and may be deposited by any means (e.g., sputter deposition) suitable for the material. Dielectric material may be formed over the structural material, for example according to any suitable build-up process so that the structural member may be integrated into a package along with electrical (e.g., fan-out or redistribution layer metallization) features.

Figure 2A:
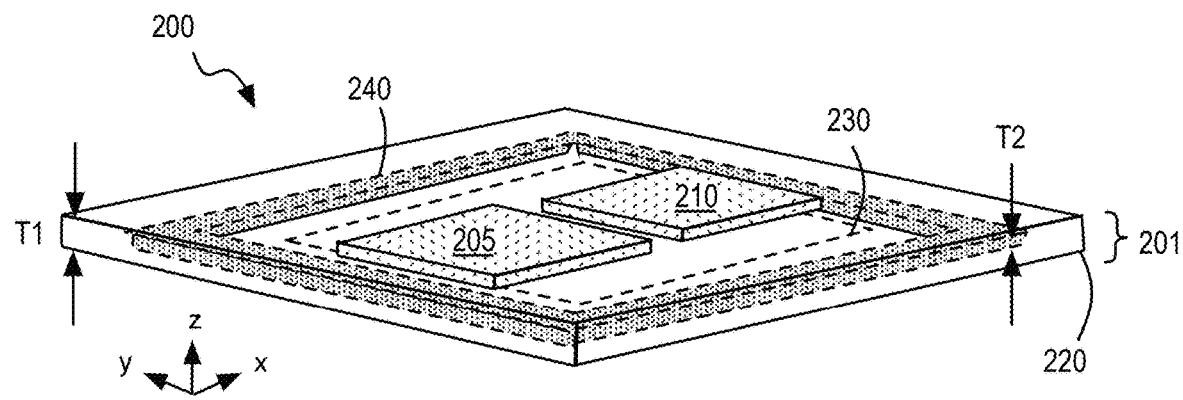
FIGS. 2A and 2B illustrate isometric views of microelectronic device package assemblies, in accordance with some embodiments.

FIG. 2A illustrates an isometric view of a microelectronic device package assembly 200, in accordance with some embodiments. Assembly 200 includes IC die 205 and 210 attached to a package (or package substrate) 201. IC die 205, 210 may each have been prepared and electrically tested, for example according to any suitable fabrication, die prep, and e-test processes. IC die 205, 210 may be coupled to package 201 through any known (first-level) interconnect. As an example, IC chip 205 may be a first of any of a wireless radio circuit, microprocessor or graphics processor circuit, electronic memory circuit, floating point gate array (FPGA), power management and/or power supply circuitry, or MEMS device. As a further example, IC chip 210 may be a second of any of a wireless radio circuit, microprocessor or graphics processor circuit, electronic memory circuit, FPGA, power management and/or power supply circuitry, or MEMS device. In some specific examples, IC die 205 is a microprocessor and IC die 210 is an electronic memory. One or more of IC die 205, 210 may comprise an IC die stack. For example, an electronic memory may comprise a stack of IC die.

Package 201 may comprise any type of substrate suitable for providing electrical communications between any electrical components, such as IC die 205 or IC die 210, and a next-level host component (not depicted) to which package 201 may be coupled. A next-level host component may be a circuit board, or another package level, for example. Package 201 may further providing electrical communication between IC die 205 and IC die 210. Package 201 may also provide structural support for IC die 205, 210. By way of example, in some embodiments, package 201 may be a multi-layer substrate that includes levels of package metallization and layers of a package dielectric material 220 that have been successively built-up around a core. The package core may be a dielectric material, for example, and may further include conductive through-via structures. In other embodiments, package 201 may comprise a coreless multi-layer substrate, in which case through-via structures may be absent.

As shown in FIG. 2A, a structural member 240 is integrated into package 201. Structural member 240 is illustrated in dashed line to emphasize it is within a sub-surface plane of package 201 while IC chips 205, 210 are shown in solid line as being coupled to a top surface of package 201. Hence, structural member 240 resides within the package thickness T1, and has some thickness T2 that is less than package thickness T1. Dielectric material 220 generally has a relatively low elastic modulus, and so may deform extensively when subjected to stress, such as that imparted through thermal expansion.

In exemplary embodiments, structural member 240 is co-planar with a package metallization level. Rather than being patterned into a feature suitable for only electrical communications, structural member 240 is of a material, has dimensions, and is positioned within package 201, to enhance package rigidity and/or otherwise control package warp. As such, structural member 240 may be of any material having a larger elastic modulus (greater stiffness) than dielectric material 220. Structural member 240, being integral to package 201, is substantially within the plane of dielectric material 220 and may significantly reduce the magnitude of package strain for a given stress.

Figure 2B:
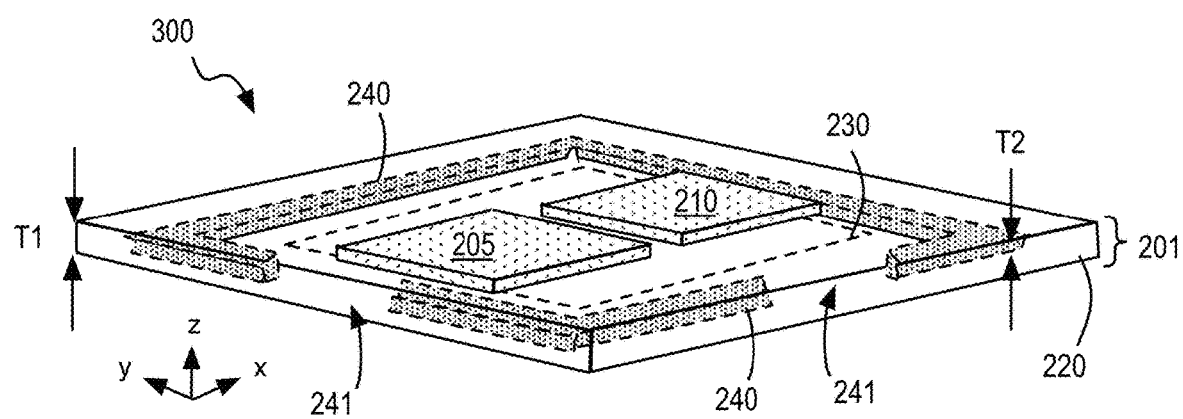

FIG. 2B illustrates an isometric view of a microelectronic device package assembly 300, in accordance with some alternative embodiments where there are a plurality of discrete structural members 240. Assembly 300 is substantially the same as assembly 200 with the exception that structural members 240 do not comprise a continuous perimeter about keep-out zone 230 with individual ones of structural members 240 separated by an intervening space 241. The locations, dimensions and number of spaces 241/structural members 240 may be predetermined to provide localized stiffening to package 201 as needed.

Figure 3A:
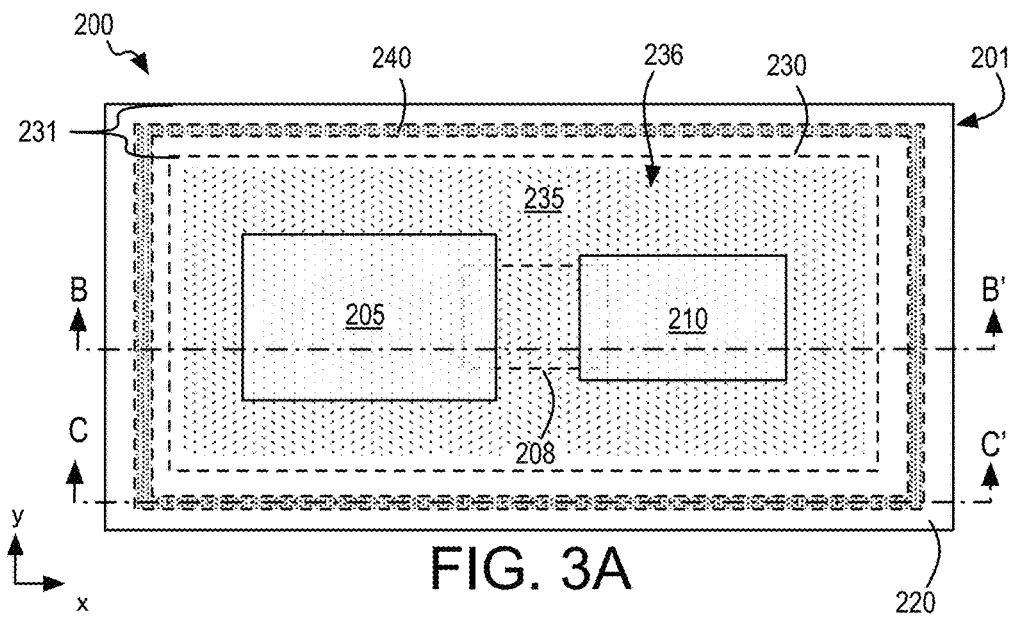
FIG. 3A illustrates a plan view of the microelectronic device package assembly shown in FIG. 2A, in accordance with some embodiments.

FIG. 3A illustrates a plan view of microelectronic device package assembly 200, in accordance with some embodiments. As shown 3A, package 201 includes an interior portion 235 and a keep-out zone 231 within a peripheral portion of package 201 that surrounds interior portion 235. Metallization structures associated with electrical communications through a particular level of package 201 may be located within interior portion 235. In this example, a plurality of conductive through vias 236 is illustrated within interior portion 235. Conductive vias 236 have a major axis (not depicted) that is substantially normal to an xy plane of package 201. A keep-out zone boundary 230 demarks a perimeter around interior portion 235 where there are no conductive through-vias 236. Structural member 240 is located within keep-out zone 231. Structural member 240 is again illustrated in dashed line to emphasize it is within a sub-surface plane of package 201 while IC chips 205, 210 are coupled to a surface of package 201.

Metallization structures associated with electrical communications may be absent from keep-out zone 231. In this example, IC die 205 and 210 are located within interior portion 235, but they need not be limited to only interior portion 235. For the illustrated embodiments where structural member 240 is co-planar with a package metallization level, structural member 240 is confined to keep-out zone 231 associated with that particular co-planar metallization level. For example, where structural member 240 is coplanar with a first package metallization level (e.g., metal zero, or "M0"), keep-out zone 231 is defined for that first package metallization level.

Within keep-out zone 231, structural member 240 may have any polygonal footprint. Structural member 240 may be a contagious feature at least partially surrounding a perimeter of package 201. For applications where structural member 240 is to increase whole-package rigidity, structural member 240 spans a majority of both a length (e.g. x-dimension) and width (e.g., y-dimension) of package 201. In the illustrated example, structural member 240 is a contiguous frame completely surrounding package interior region 235 where there is electrical routing. In other embodiments, structural member 240 may be discontinuous, for example with one or more structural components that only partially frame interior region 235. Structural member 240 may extend only along a majority of one of the x and y dimensions, or may not extend along a majority of either the x or y dimensions of package 201.

As further illustrated in dashed line, package assembly 200 includes an IC 208 that is also located within package interior region 235, and at least partially embedded within package 201. IC 208 is illustrated in dashed line to emphasize that IC 208 is in a plane of package assembly 200 that is below both IC 205 and IC 210. IC 208 may, for example, communicatively couple IC 205 to IC 210. IC 208 may include IC-scale metallization interconnecting IC die 205 to IC die 210 as a communication bridge. Such a package architecture may benefit from greater package rigidity local to the interconnects between IC die 208 and each of IC die 205 and IC die 210.

Figure 3B:
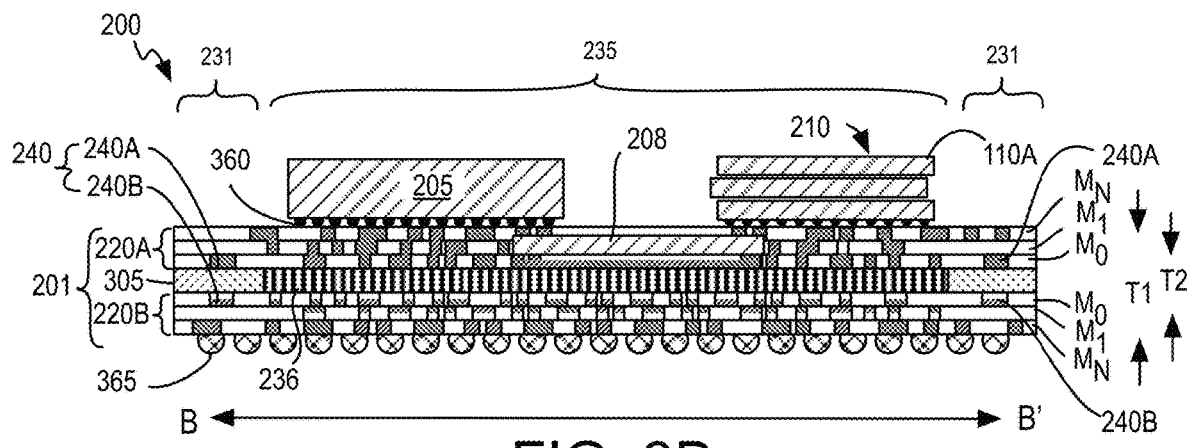
FIGS. 3B and 3C illustrate cross-sectional views of the microelectronic device package assembly shown in FIG. 2A, along the B-B and C-C lines shown in FIG. 3A, in accordance with some embodiments.
Figure 3C:
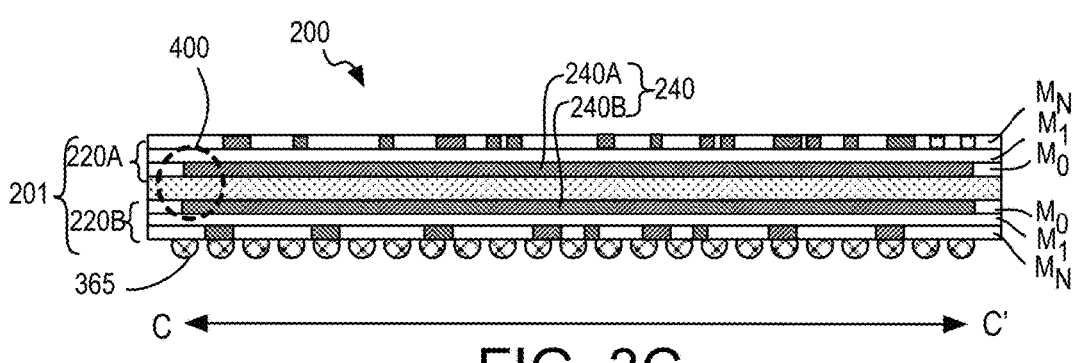

FIGS. 3B and 3C illustrate cross-sectional views of the microelectronic device package assembly 200, along the B-B and C-C lines shown in FIG. 3A, in accordance with some embodiments. Both package interior region 235 and keep-out zone 231 are visible in FIG. 3B. Only keep-out zone 231 is visible in FIG. 3C. As further shown in FIGS. 3B and 3C, package 201 includes a core 305 with dielectric material layers 220A on a first side of core 305 and dielectric material layers 220B on a second, opposite, side of core 305. Core 305 may be of any substrate material known to be suitable for IC packages. Conductive through-vias 236 are visible within package interior region 235, and are absent from keep-out zone 231. Conductive through-vias 236 may comprise a plated metal, such as copper for example.

Dielectric material 220 (both 220A and 220B) may be any material suitable for package applications, such as, but not limited to, organic dielectrics. Exemplary organic dielectrics include polyimides, novalaks, epoxy-phenolic resins or epoxy cyanate ester resins. Each of dielectric material layers 220A and 220B may have thicknesses ranging between 10 and 100 microns, for example. In the illustrated examples, dielectric materials 220A and 220B are build-up films that may be laminated upon package core 305. Alternatively, package 201 may have a coreless architecture where dielectric materials are instead build-up on a temporary carrier panel.

In the illustrated example, package 201 accommodates flip-chip assembly, with IC die 205 and 210 coupled to package 201 through first-level interconnects 360 (e.g., solder features). Packages in accordance with some embodiments may instead, or in addition, be suitable for bumpless build-up package architectures where an IC die is bonded to package material and/or package material is built-up around an IC die, for example as illustrated for IC die 115. Other package architectures are also compatible with integral structural members in accordance with other embodiments, such as, but not limited to, any fan-out package in which metal redistribution layers are fabricated. The cross-sectional view of FIG. 3B further illustrates how IC die 210 may further comprise a stack of any number of IC die 210A.

FIGS. 3B and 3C further illustrat layers of package metallization between dielectric material layers 220A and 220B. The package may comprise copper, other suitable metals, or other conductive materials electroplated or otherwise formed directly on dielectric material, for example after a given iteration of a lamination process. There may be any number of package metallization levels within the package 201. The highest metallization level may be the Nth metallization level ($M_N$) at or nearest to a first (e.g., front) side of the package 201. The Nth metallization level is over a base metallization level, metal zero ($M_0$), which is most distal from the first side of package 201, and in the illustrated example in direct contact with core 305. Any number of intermediate package metallization levels (e.g., $M_1$) may be between metallization levels $M_N$ and $M_0$. As shown in FIGS. 3B and 3C, package 201 is substantially symmetric about core 305 with metallization levels $M_0$-$M_N$ also present on the second (e.g., back) side of package 201. Bottom-level metallization (e.g., comprising die interconnects) is generally the level of metallization nearest to a second (e.g., bottom) side of package substrate stack 201.

A metallization level (e.g., copper) may be sputtered, plated, or a foil may be laminated as a metallization level. Each metallization level $M_0$-$M_N$ may have a thickness of 5-50 microns, for example, and may be patterned to vertically route electrical communications through package thickness T1 (e.g., through dielectric materials 220A, through core 305, and through dielectric materials 220B). For embodiments where metallization levels are plated, metallization features in each level may be formed by a SAP process where a plating mask may have been employed, or by an mSAP process where a foil is applied and a masked etch process (e.g., wet chemical) is employed.

As further illustrated in FIGS. 3B and 3C, package 201 includes second level interconnects 365, which may be solder balls or other solder features, for example. Package metallization level routing may therefore electrically couple second level interconnects 365 to first-level interconnects 360. Because of the various design demands on such electrical routing, package metallization level features within package interior region 235 may have little impact on stiffness or other mechanical properties of package 201. Hence, structural member(s) 240 within keep-out zone 231 may be relied upon primarily for tuning mechanical properties of package 201. As shown, structural member 240 comprises a first structural component 240A that is co-planar with the metallization level most proximate to core 305 (e.g., $M_0$). Keep-out zone 231 may therefore be particular to this $M_0$ metallization level, with other metallization levels (e.g., $M_N$) having electrical features extending into keep-out zone 231. Within the $M_0$ metallization level however, electrical routing features are absent from keep-out zone 231. It should be noted that although structural component 240A has primarily a structural function, it is not precluded from further serving some secondary electrical function, such as a ground plane and/or EM shield, for example.

As also shown in FIGS. 3B and 3C, structural member 240 further includes a second structural component 240B that is co-planar with a second metallization level most proximate to the opposite side of core 305 (e.g., $M_0$). Keep-out zone 231 may therefore be applicable to this symmetric $M_0$ metallization level. Together, structural components 240A and 240B may act together as structural member 240 that symmetrically improve stiffness of package 205, for example resisting deflection of the x-y plane. Although structural components 240A and 240B are co-planar with only the $M_0$ metallization level, a structural member (or components thereof) may span any number of metallization levels (e.g., levels $M_0$-$M_1$).

The profiles shown in FIG. 3C and FIG. 3B illustrate structural components 240A, 240B (and therefore the structural member 240) are substantially rectilinear. The stiffness of structural member 240 may therefore be dependent, at least in part, upon thickness T2 that is a sum of twice the thickness of metallization level $M_0$ and a thickness of package core 305. Region 400 demarked by dashed line in FIG. 3C is expanded in FIG. 4A. Within the $M_0$ package keep-out zone 231, structural components 240A, 240B are in contact with a seed metal 414A, 414B, respectively. Seed metals 414A, 414B are in direct contact with core 305 and may have been deposited (e.g., sputtered) upon package core 305, for example. Being substantially monolithic, structural components 240A and 240B are therefore strongly adhered to package core 305 and can directly supplement the stiffness of package 201.

As noted above an integral structural member may comprise any material having a larger elastic modulus than the surrounding package dielectric material layers 420A, 420B, 421A, 421B, etc. In some exemplary embodiments, an integral structural member comprises one or more metals, such as, but not limited to copper or nickel. For example, each of structural components 240A, 240B may comprise the metal employed as the $M_0$ metallization level (e.g., predominantly copper). In some alternative embodiments, an integral structural member comprises predominantly silicon (e.g., amorphous silicon), an inorganic dielectric material (e.g., $SiO_2$, SiN, SiON), or a carbonaceous material (e.g., diamond-like carbon) as any of these materials may be deposited (e.g., sputtered) through a variety of means that are compatible with package technology and may also have a relative high elastic modulus.

Figure 4A:
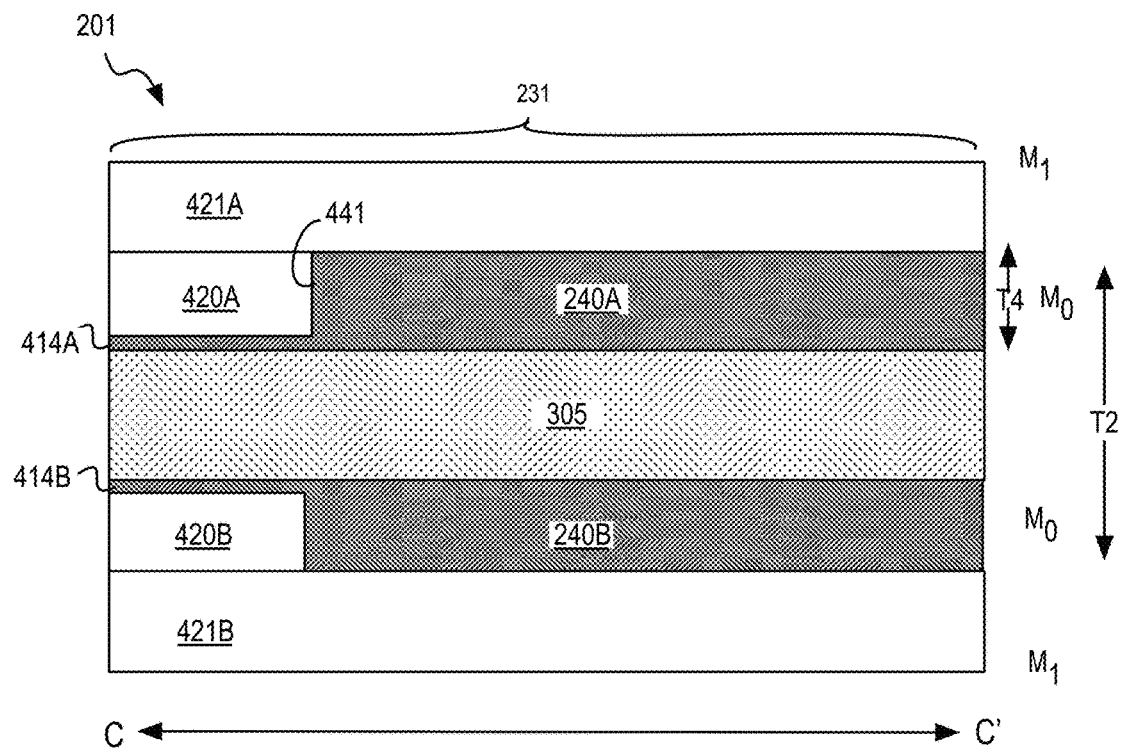
FIGS. 4A, 4B and 4C illustrate cross-sectional views of a package keep-out zone, in accordance with some embodiments.

Although seed metals 414A, 414B may be removed (e.g., with an unpatterned flash etch), the presence of seed metal is indicative of structural components 240A and 240B having been electroplated for those embodiments where structural components 240A and 240B comprise a metal amenable to plating, such as a copper. The vertical profile of sidewall 441 is further indicative of an additive process, for example where structural components 240A, 240B have been plated through a patterned plating mask. For alternative embodiments where a subtractive etch process is employed to pattern structural components 240A, 240B, sidewall 441 can be expected to have a more positively slope sidewall profile than is illustrated in FIG. 4A.

For the illustrated "filled-trench" or "solid" $M_0$ profile, structural components 240A and/or 240B may provide a particular stiffness improvement for a given $M_0$ thickness T4, as a function of the structural material composition (and associated elastic modulus). For example, where structural components 240A and/or 240B are copper, the stiffness of package 201 may be increased to nearly twice, or even 3×, that of a package lacking structural components 240A and/or 240B as a function of the $M_0$ thickness T4. For some further embodiments, stiffness of an integral structural member may be further tuned though more extensive patterning, for example to define intersecting structural elements that may together form a contiguous structural member having a truss architecture.

Figure 4B:
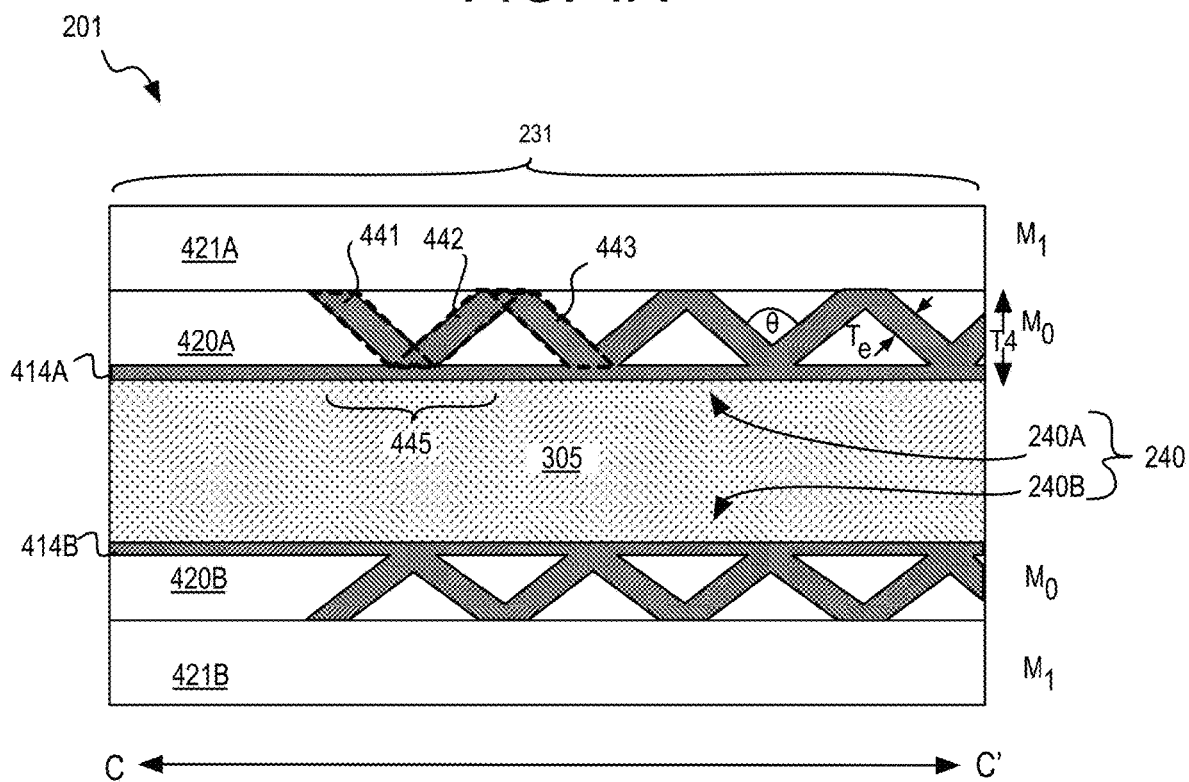

FIG. 4B illustrates a cross-sectional view of package keep-out zone 231, in accordance with some alternative embodiments where structural components 240A and 240B each have a truss architecture. As shown, structural components 240A, 240B include a plurality of intersecting structural elements spanning the $M_0$ thickness T4. Structural component 240A, for example, includes a structural element 442 intersecting adjacent structural elements 441 and 443. In the truss configuration, structural element 442 intersects adjacent structural element 441 proximal to package core 305 (i.e., distal from a nearest surface of package 201), and further intersects adjacent structural element 443 distal from package core 305 (i.e., proximal to the nearest surface of package 201). As shown, adjacent interconnected structural elements combine into a repeating, alternating chevron pattern profile. In the further presence of seed layer 414A, structural component 240A has alternating triangle-shaped spaces between adjacent structural elements 441-443. As further shown in FIG. 4B, stiffness of the truss architecture may be tuned for a given package application through control of one or more of at least the element intersection angle θ, and element thickness $T_e$. Although illustrated with a well-define "V" or "Λ" shape, chevron patterns may vary from "V" shape to a "U" shape, or from a "Λ" shape to a "⌒" shape.

Figure 4C:
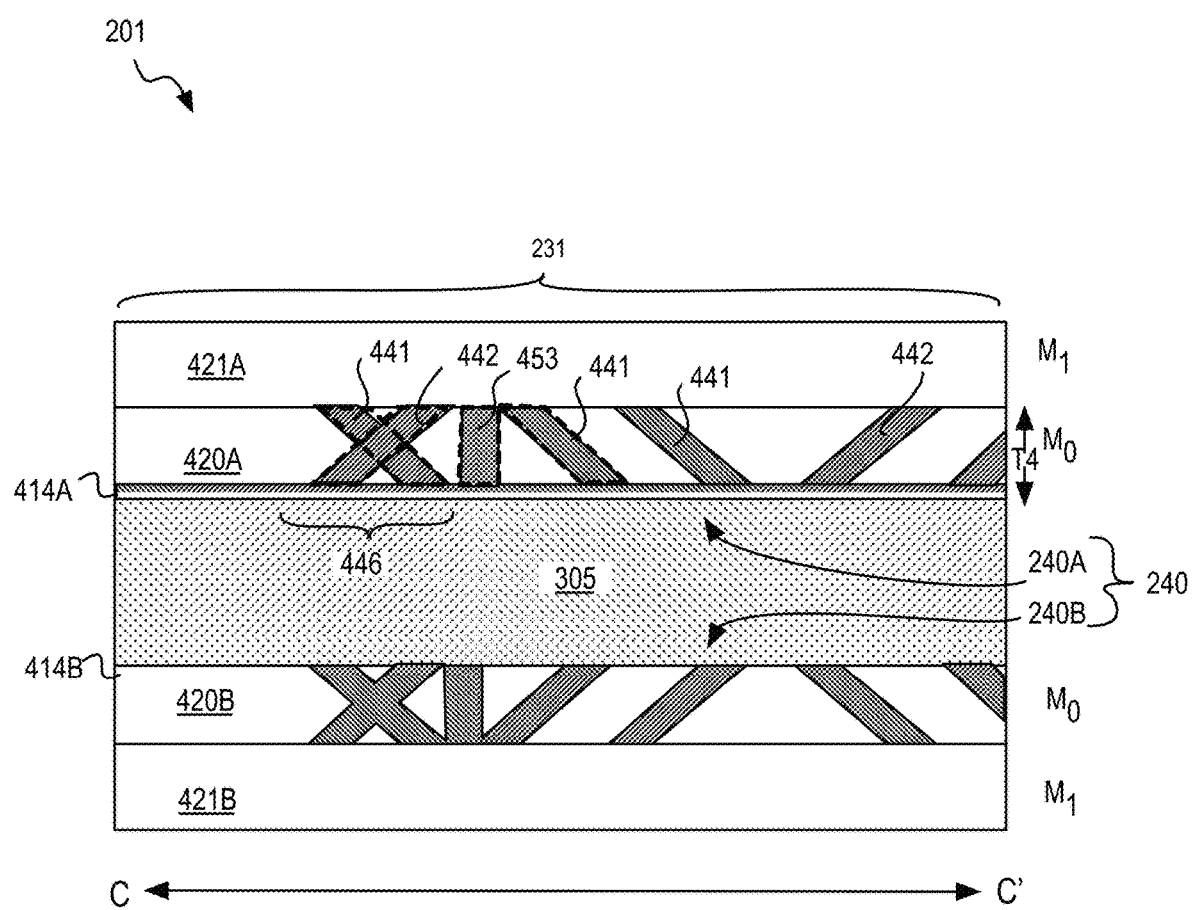

FIG. 4C illustrates a cross-sectional view of package keep-out zone 231, in accordance with some other alternative embodiments. As shown, a truss architecture may vary widely with a number of exemplary structures depicted. As shown, structural components 240A, 240B include a plurality structural elements non-orthogonal to a plane of package 201 and spanning the $M_0$ thickness T4. Structural component 240A, for example, includes structural element 442 intersecting adjacent structural elements 441 and 453. In this truss configuration, structural element 441 crosses adjacent structural element 441 near a midpoint of the thickness of dielectric material layers 420A, forming a "x-beam" structure. FIG. 4C further illustrates how some elements of a structural member may be vertically oriented. For example, structural element 453 is substantially normal to a plane of package 201, and is therefore similar to an electrical interconnect. Hence, a structural member may integrate both vertical and non-vertical elements. As further shown in FIG. 4C, adjacent structural elements can also be non-interconnected chevron and/or semi-chevron pattern profiles. For example, a plurality of structural elements 441 having the same non-vertical angle may be adjacent and discrete to form a semi-chevron pattern with stiffness of the truss architecture tunable by maintaining a given pattern throughout a structural member's longitudinal length or by varying between patterns over a structural member's longitudinal length.

Figure 5A:
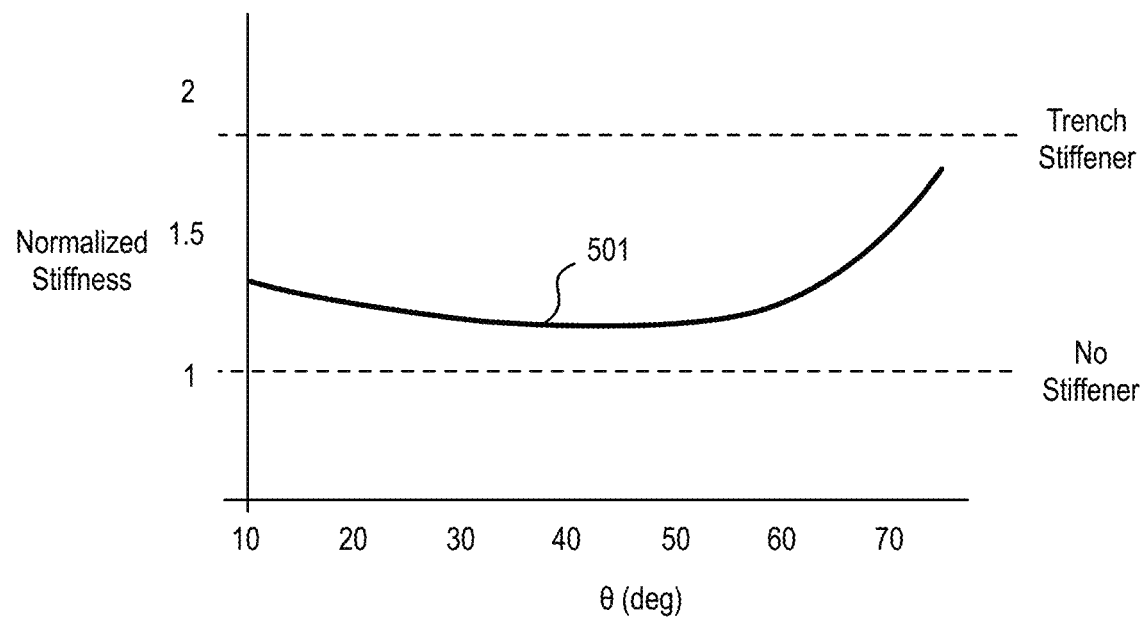
FIG. 5A is a graph illustrating package stiffness as a function of an intersection angle of package structural elements, in accordance with some embodiments.

FIG. 5A is a graph illustrating package stiffness as a function of an intersection angle of package structural elements, in accordance with some embodiments. As shown, the stiffness of a reference package lacking any structural member defines a normalized package stiffness value of 1. Stiffness of a package having an integral structural member comprising two $M_0$ components with a filled-trench/solid profile of the type illustrated in FIG. 4A is further demarked in FIG. 5A as having a normalized stiffness value of around 1.75. Stiffness of a package having an integral structural member comprising two $M_0$ components employing the truss architecture as illustrated in FIG. 4B and with a fixed element thickness $T_e$ is further plotted as curve 501. As shown, package stiffness may be tuned between a normalized stiffness value of approximately 1.2 to 1.6 by varying the intersection angle between approximately 10° and approximately 80°.

Figure 5B:
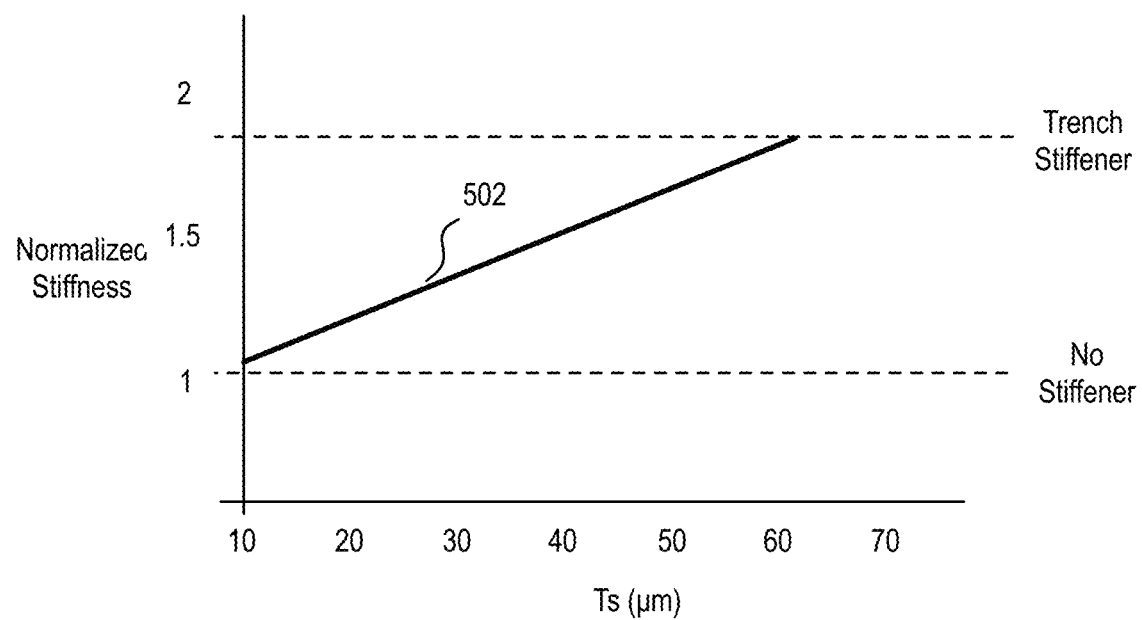
FIG. 5B is a graph illustrating package stiffness as a function of thickness of package structural elements, in accordance with some embodiments.

FIG. 5B is a graph further illustrating package stiffness as a function of thickness of package structural elements, in accordance with some embodiments. The normalized stiffness values of 1 and 1.75 are again shown for reference. Stiffness of a package having an integral structural member comprising two $M_0$ components employing the truss architecture as illustrated in FIG. 4B and with a fixed element intersection angle θ is further plotted as line 502. As shown, package stiffness may be tuned anywhere between the normalized stiffness values of 1 and 1.75 by varying the element thickness between approximately 10 and 70 μm.

Figure 6:
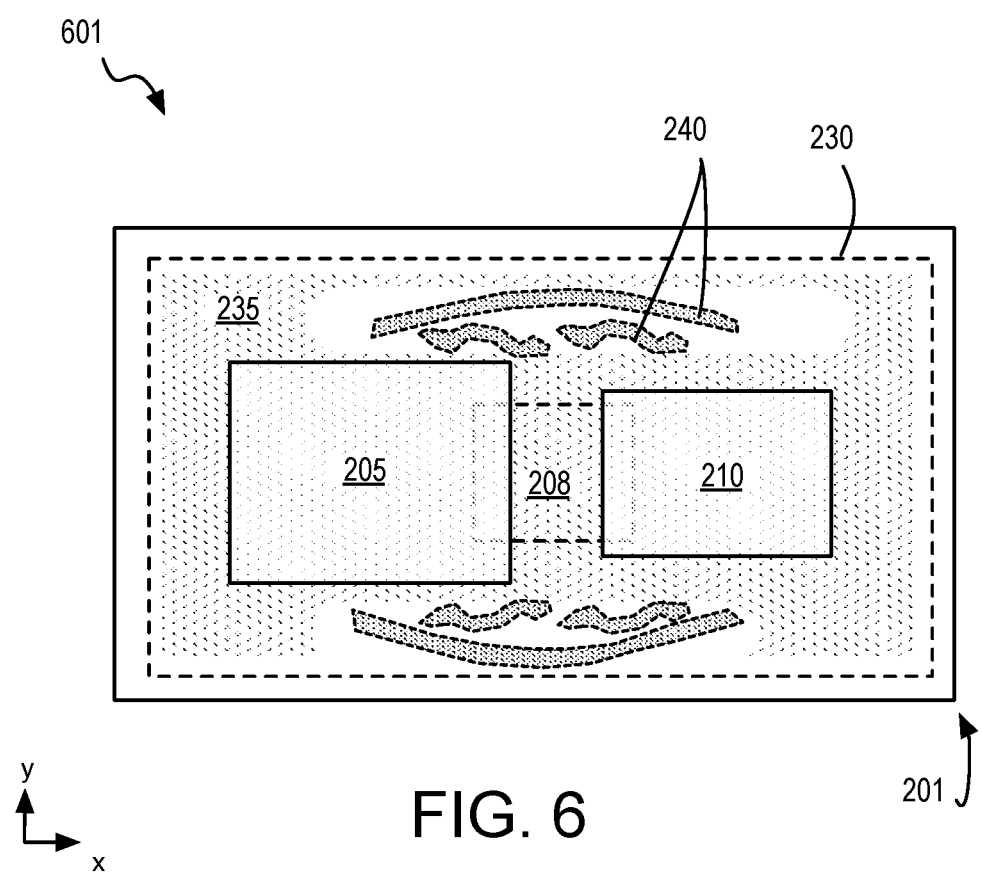
FIG. 6 illustrates a plan view of a microelectronic device package in accordance with some alternative embodiments.

Aspects of integral package structural members described above may be implemented into many form factors within a package beyond the rectilinear frame illustrated in FIGS. 2A and 3A. For example, a structural element having any curved shape may be be implemented with either solid contiguous structural component or a contiguous interconnected framework of structural elements. FIG. 6, illustrates a plan view of a microelectronic device package assembly 601 in accordance with some alternative embodiments that include localized structural members 240. In contrast to the global, or package-level structural member 240) as illustrated in FIGS. 2A and 3A, for example, localized structural members 240 as illustrated in FIG. 6 have a longitudinal length (e.g., predominantly in the x-dimension) that is no more than one-half the length of package 201. The short length of structural members 240 may serve to limit any associated stiffness increase primarily to a localized region proximal to the structural members 240. In this example with structural members 240 near IC die 208, joints to IC dies 205 and 210 may be protected from the effects of excessive warpage. In device assembly 601, structural members 240 also illustrate how a structural member may follow any arbitrary curved path, predetermined for any packaging application, for example with a suitable finite element modeling algorithm.

Figure 7:
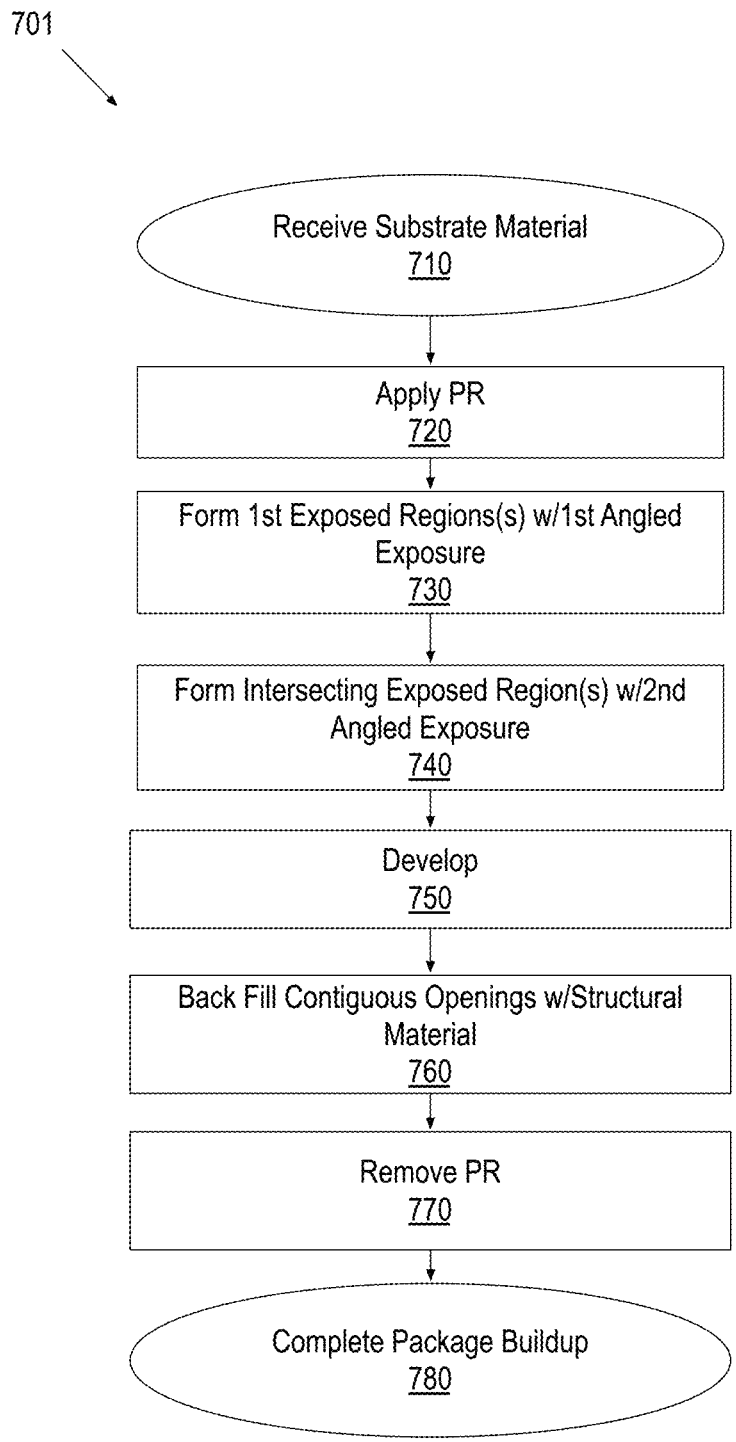
FIG. 7 is a flow diagram illustrating methods of fabricating structural elements for application specific packages, in accordance with some embodiments.

Aspects of integral package structural members described above may be implemented through the practice of a wide variety of package fabrication techniques. FIG. 7 is a flow diagram illustrating exemplary methods 701 of fabricating structural elements for application specific packages, in accordance with some embodiments. Methods 701 may, for example, be practiced to fabricate a package that includes the integral structural members illustrated in FIG. 4B. Methods 701 are therefore a subset of a more general method that may be practiced to instead form the less complex "solid" structural members illustrated in FIG. 4A, for example. FIG. 8A-8H illustrate cross-sectional views of a package with exemplary structural elements evolving as the methods illustrated in FIG. 7 are practiced, in accordance with some embodiments. Notably, however, other methods may be practiced to fabricate the exemplary integral structural members described herein. Similarly, methods 701 may also be practiced to fabricate integral structural members other than those specifically provided herein as examples.

Figure 8A:
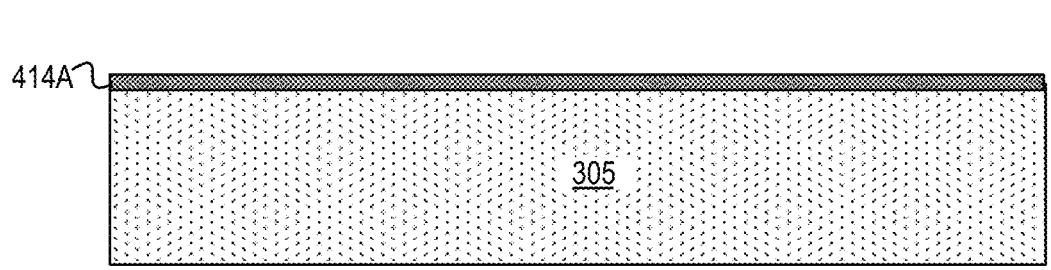
FIG. 8A-8H illustrate cross-sectional views of a package with structural elements evolving as the methods illustrated in FIG. 7 are practiced, in accordance with some embodiments.

Referring first to FIG. 7, methods 701 begin at 710 where a substrate material is received. The substrate material may be any upon which a structural member may be formed. FIG. 8A illustrates one example, where a substrate material includes a seed metal layer 414A upon one side of package core 305. In coreless embodiments, substrate material may be any suitable package dielectric material. A shown in FIG.

8A, the substrate material has been prepped for the formation of a first package metallization level ($M_0$).

Figure 8B:
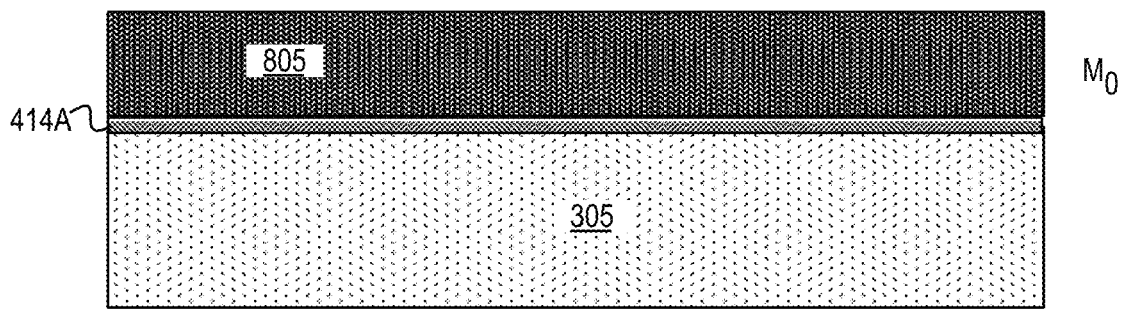
Figure 8C:
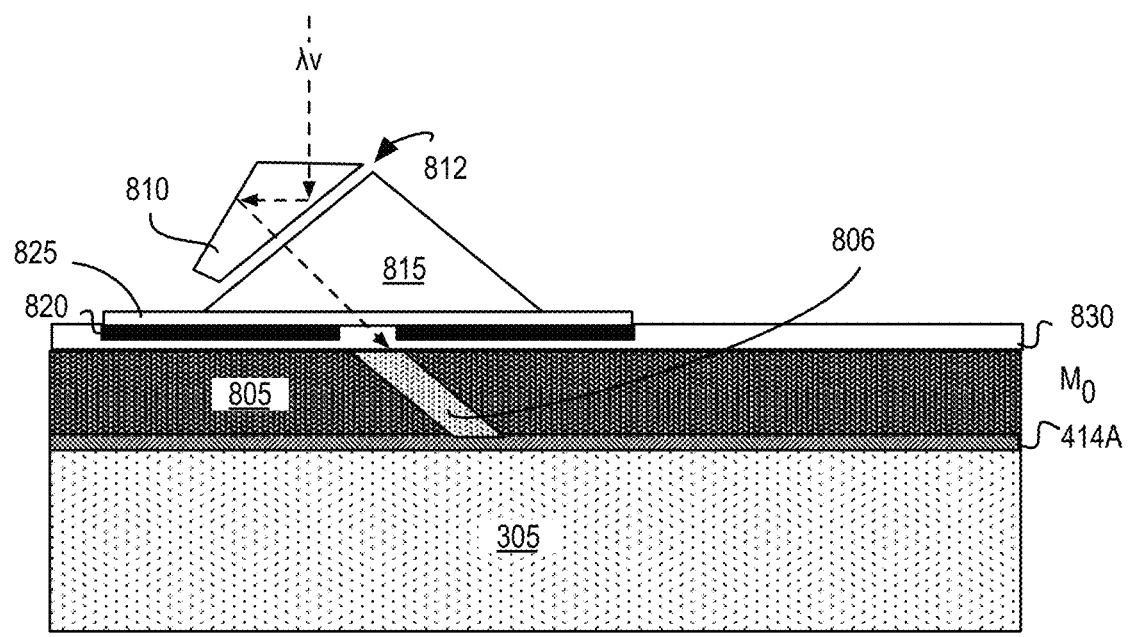
Figure 8D:
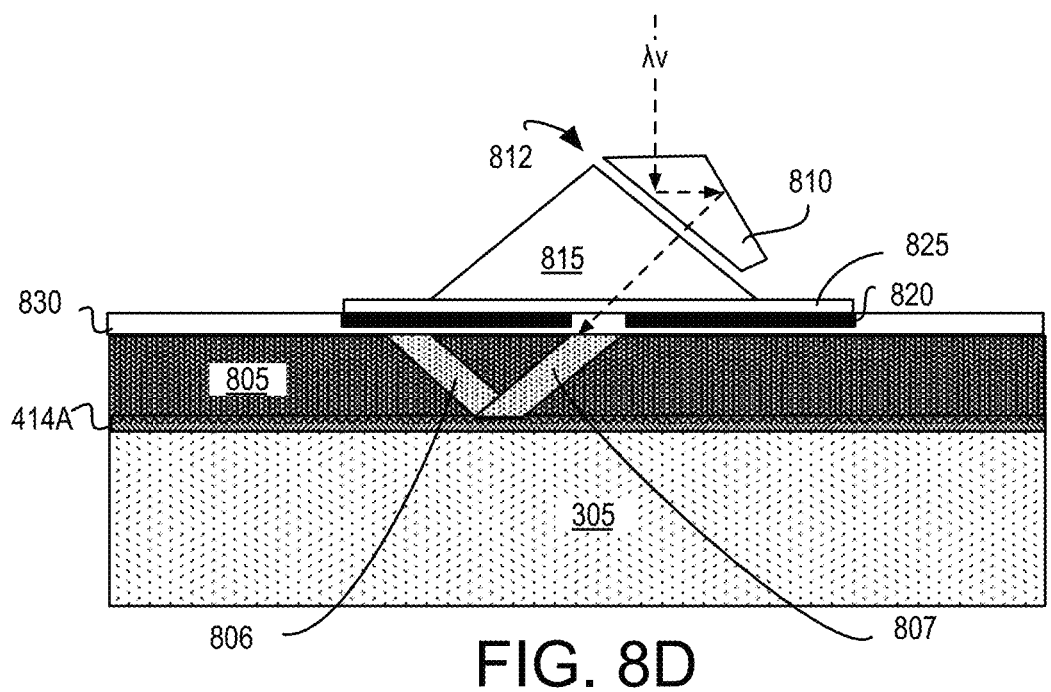
Figure 8E:
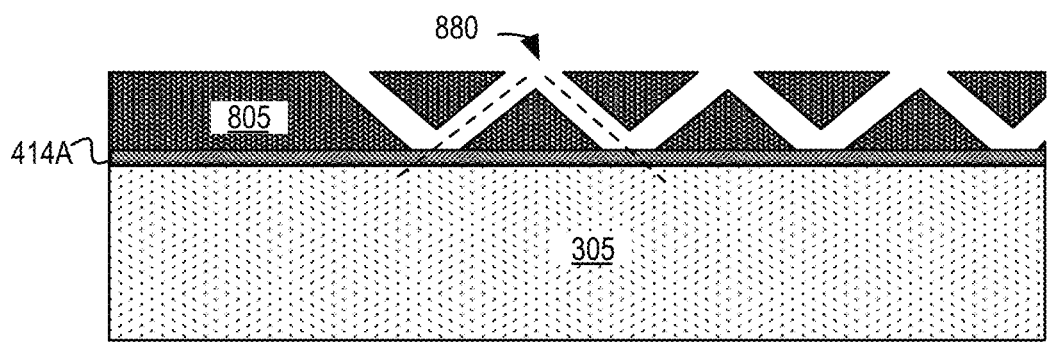
Figure 8F:
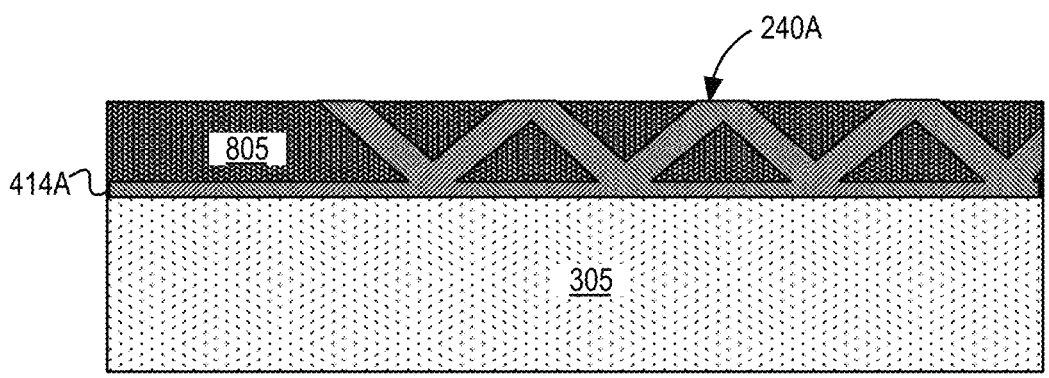
Figure 8G:
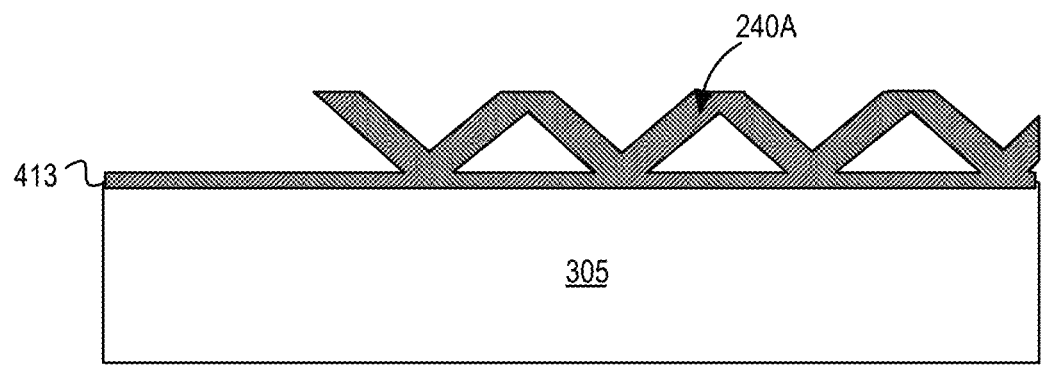

Returning to FIG. 7, methods 701 continue at block 720 where a mask is applied over the substrate material. For such semi-additive processes, the mask applied at block 720 may be any mask suitable for defining the selective deposition of a structural material. In the exemplary embodiment, block 720 entails the application of a photo resist (PR) mask. FIG. 8B further illustrates an example where photoresist is applied as a dry film resist (DFR) 805 laminated upon the seed metal layer 414A according to any technique known to be suitable.

Returning to FIG. 7, methods 701 continue at block 730 where a first exposed region is formed in the photoresist with a first angled exposure. The angled exposure is a specific technique enlisted to pattern a network of intersecting features that are angled non-normal to a plane of the substrate material. Any conventional exposure technique may be employed for alternative embodiments where an opening substantially normal to the plane of the substrate is desired (e.g., to patterned to typical trench). In the example further illustrated in FIG. 8C, a photoresist region 806 is exposed to a radiation of λv propagating along an optical path angled non-normal to a plane (e.g., xy plane) of core 305 (and DFR 805). As shown, the optical path of the exposure radiation, denoted by a dashed ray, passes through a half-penta prism 810. The optical path of the exposure radiation further passes through a right angle prism 815 that is between the workpiece and half-penta prism 810. To harness the various prism facets, the half-penta prism 810 is separated from the right angle prism 815 by an air gap.

In the illustrated embodiment, an index matching gel 825 is between right angle prism 815 and a mask (reticle/pellicle assembly) 820. Water (immersion) 830 is between mask 820 and DFR 805. With this lens/optical media arrangement, exposure radiation initially propagated in a direction substantially normal to the xy plane of package core 305 (and DFR 805) is redirected to a non-normal angle of incidence, which may be set to a predetermined angle (e.g., 30° off-normal to xy plane of core 305) as a function of the geometry of facets on the half-penta prism 810.

Returning to FIG. 7, methods 701 continue at block 740 where a second exposed region is formed with another exposure angled to intersect the first opening. In some embodiments, the exposure apparatus employed in block 730 may be reoriented by 180° relative to the workpiece and appropriated translated relative to the first exposure prior to performing a second exposure of the photoresist. For the example shown in FIG. 8D, a second photoresist region 807 is exposed with the radiation of Av again propagating along an optical path angled non-normal to a plane (e.g., xy plane) of core 305 (and DFR 805). As shown, the optical path of the exposure radiation, denoted by a dashed ray is aligned substantially orthogonal to the previously exposed photoresist region 806 so that the exposed regions intersect near the interface between DFR 805 and seed metal layer 414A. These exemplary exposures are replicated over a path where a contiguous structural member is to be defined over some portion of the workpiece.

Returning to FIG. 7, methods 701 continue at block 750 where the photoresist is developed with any chemical treatment suitable for the particular photoresist formulation. In the example illustrated in FIG. 8E where DFR 805 is a positive tone material, exposed regions 806, 807 are developed away leaving unexposed regions defining a contiguous pattern feature 880 comprising openings with a major axis (dashed lines) non-orthogonal to the xy-plane of core 305. With adjacent openings intersecting, the contiguous feature has zigzag cross-sectional profile.

Methods 701 (FIG. 7) continue at block 760 where the structural material is deposited with a technique suitable for at least partially backfilling the pattern defined in the photoresist. While any deposition process suitable for the chosen structural material and compatible with photoresist may be employed at block 760, in some exemplary embodiments the structural material (e.g., copper) is selectively plated into the features pattern in the photoresist. In the example illustrated in FIG. 8F, structural element 240A is electrolyticly plated up from seed metal layer 414A to backfill contiguous pattern feature 880. Hence, in exemplary embodiments where $M_0$ is plated as an electrical structure within a portion of a package, orthogonally oriented conductive vias may be formed concurrently with the formation of non-orthogonally oriented conductive vias as structural elements within a keep-out zone of the package. Plating overburden from both electrical and structural vias may be planarized with a surface of photoresist 805, for example, to arrive at the depicted structural member.

Figure 8H:
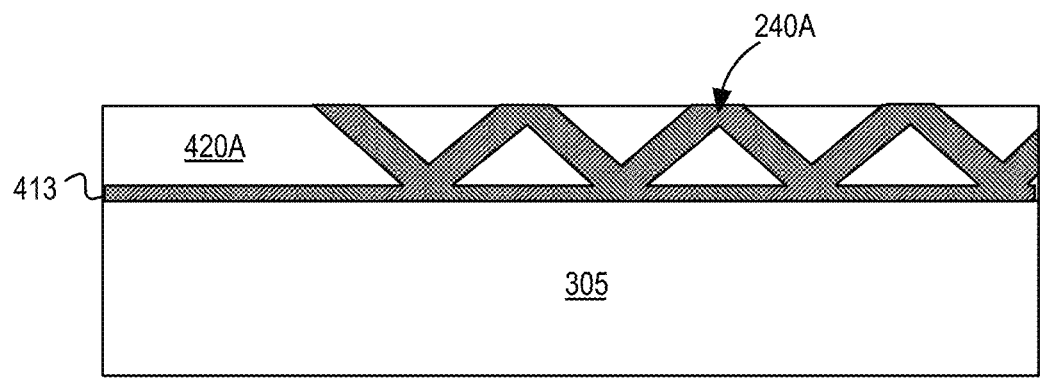

Returning to FIG. 7, methods continue at block 770 where the photoresist is removed, for example with any process suitable for the photoresist formulation and compatible with the structural material. Methods 701 are then completed at block 780 where a dielectric material is deposited over (and around) structural elements of the structural member(s). In the example shown in FIG. 8G, DFR 805 has been selectively removed leaving a free-standing structural member 240A. In alternative embodiments, the photoresist may be retained as the package dielectric. Any number of additional build-up layers (and metallization levels) may be further added according to any suitable techniques to complete the package. In FIG. 8H dielectric material 420A is applied (e.g., laminated) over structural member 240A, embedding it within the package. Additional build-up layers may be formed to arrive at the package 201 substantially as shown in FIG. 4B (following double-sided processing).

Figure 9:
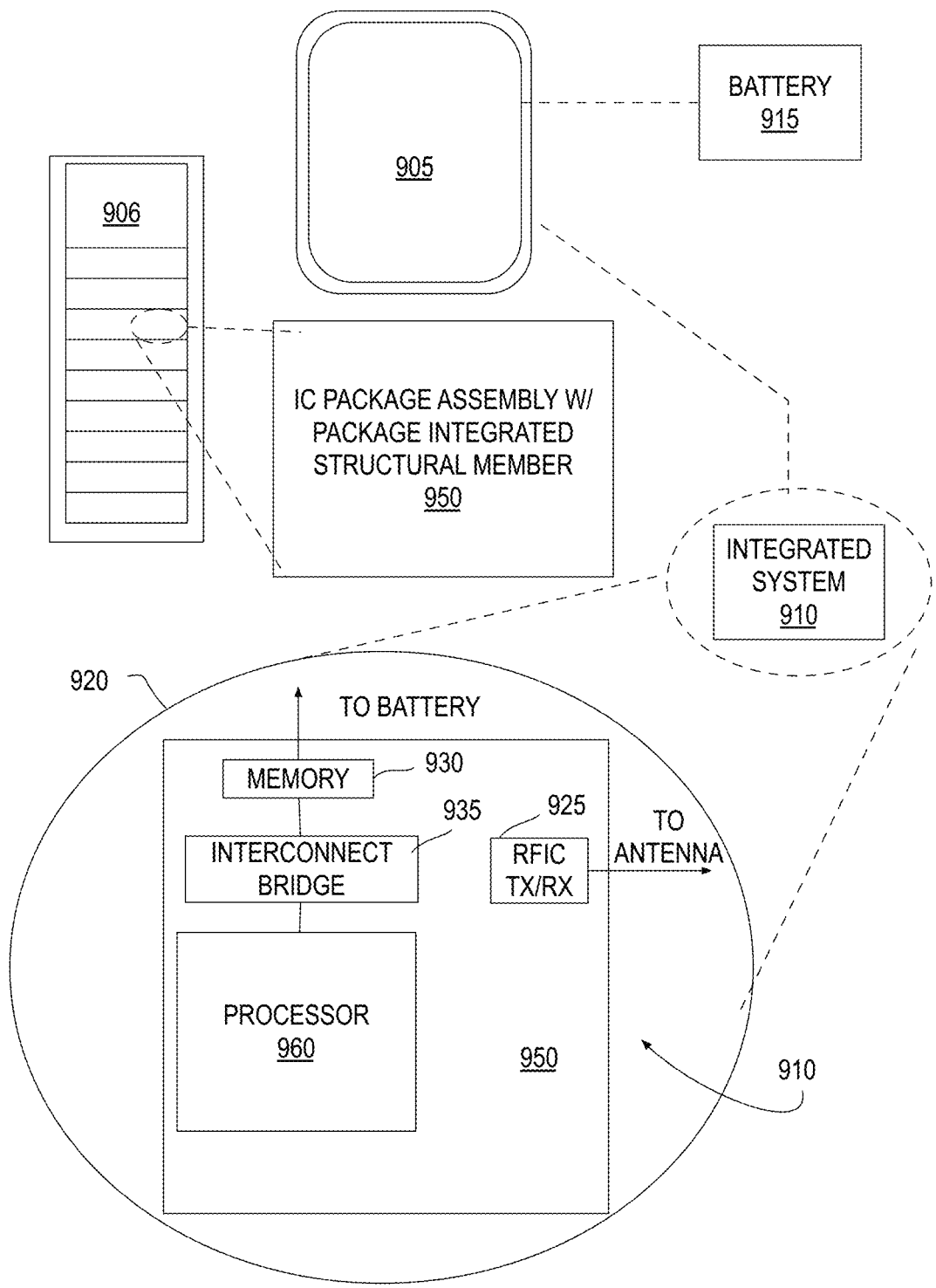
FIG. 9 illustrates a mobile computing platform and a data server machine employing an integrated circuit package including an integral structural member, in accordance with some embodiments.

FIG. 9 illustrates a system in which a mobile computing platform 905 and/or a data server machine 906 that includes an IC package assembly 950 further including a package integrated structural member, for example in accordance with some embodiments describe elsewhere herein. The server machine 906 may be any commercial server, for example including any number of high-performance computing platforms disposed within a rack and networked together for electronic data processing, which in the exemplary embodiment includes IC package assembly 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a package-level integrated system 910, and a battery 915.

Whether disposed within the integrated system 910 illustrated in the expanded view 920, or as a stand-alone packaged chip within the server machine 906, IC package assembly 950 may include memory circuitry (e.g., RAM) 930, logic circuitry (e.g., a microprocessor 960, graphics processor, or the like). IC package assembly 950 may be further coupled to a host board, interposer, or component (not depicted). In the illustrated example, IC package assembly 950 includes an interconnect bridge IC 935 communicatively coupled to both memory IC 930 and processor 960, for example to facilitate their interconnection.

IC package assembly 950 further includes an RFIC 925 having an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 10:
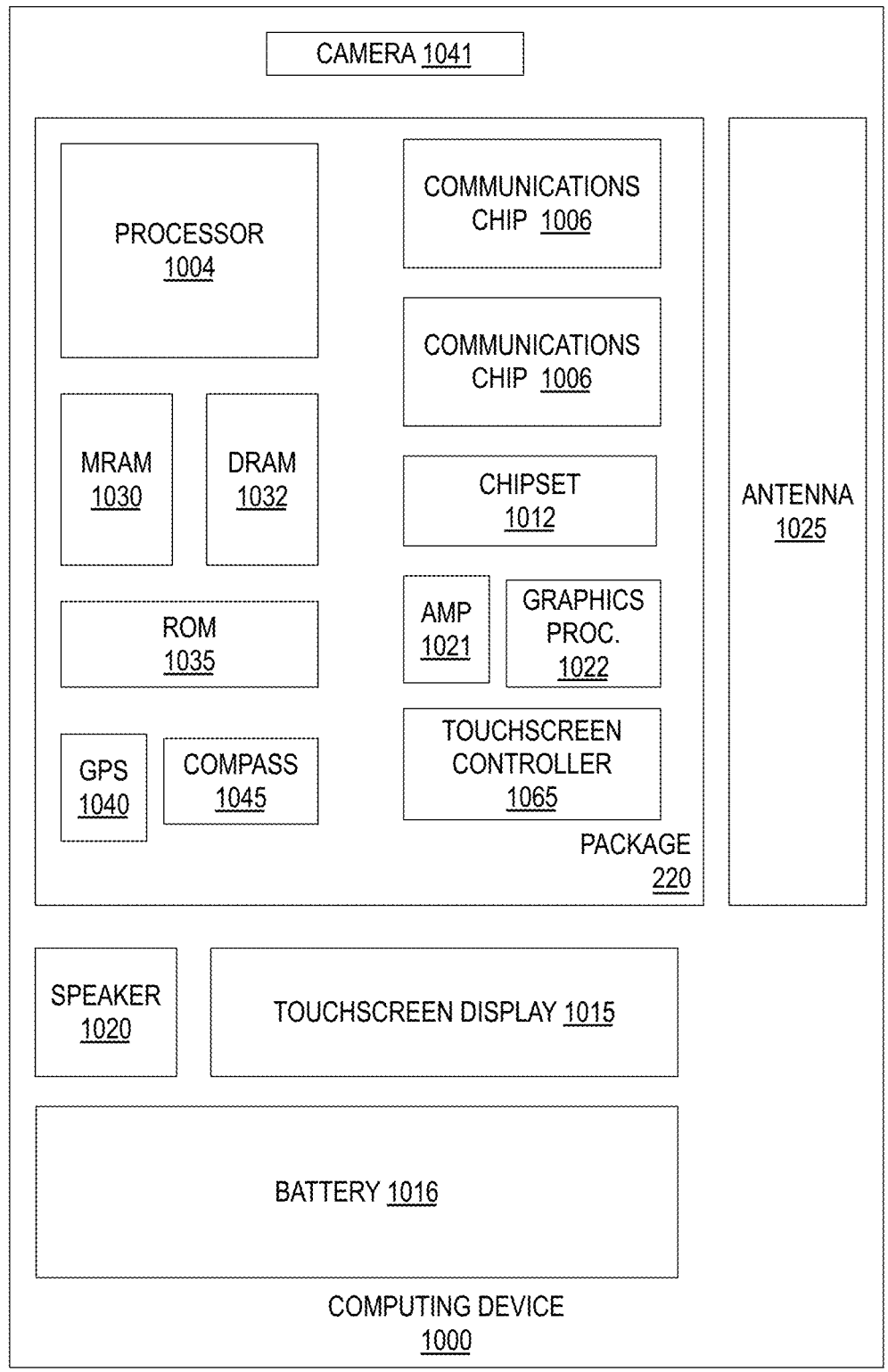
FIG. 10 is a functional block diagram of an electronic computing device, in accordance with some embodiments.

FIG. 10 is a functional block diagram of an electronic computing device 1000, in accordance with some embodiments. Device 1000 further includes a motherboard 1002 hosting a number of components, such as, but not limited to, a processor 1004 (e.g., an applications processor). Processor 1004 may be physically and/or electrically coupled to motherboard 1002. In some examples, processor 1004 is part of an IC package assembly including an integral structural member, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM 1032), non-volatile memory (e.g., ROM 1035), flash memory (e.g., NAND or NOR), magnetic memory (MRAM 1030), a graphics processor 1022, a digital signal processor, a crypto processor, a chipset 1012, an antenna 1025, touchscreen display 1015, touchscreen controller 1065, battery 1016, audio codec, video codec, power amplifier 1021, global positioning system (GPS) device 1040, compass 1045, accelerometer, gyroscope, speaker 1020, camera 1041, and mass storage device (such as hard disk drive, solid-state drive (SSD), compact disk (CD), digital versatile disk (DVD), and so forth, or the like. Any of these components may be assembled to a package that includes an integral structural member, for example according to one or more embodiments described elsewhere herein.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including, but not limited to, those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) package comprises a dielectric material, one or more metallization levels within the dielectric material, and a structural member within the dielectric material, the structural member within a keep-out zone of a co-planar one of the metallization levels.

In second examples, for any of the first examples the structural member has a higher elastic modulus than the dielectric material.

In third examples, for any of the first through second examples the structural member comprises predominantly a metal, silicon, or an inorganic dielectric material.

In further examples, for any of the first through third examples the structural member comprises plurality of intersecting elements.

In fifth examples, for any of the fourth examples a first and a second of the elements intersect proximal to a surface of the substrate, the first of the elements further intersects a third of the elements distal from the surface, and the second of the elements further intersects a fourth of the elements distal from the surface.

In sixth examples, the first and second of the elements comprise a first chevron structure or x-beam structure, and the third and fourth of the elements comprise a second chevron structure or x-beam structure, and wherein the structural member comprises a plurality of adjacent chevron or x-beam structures along at least a portion of a perimeter around the keep-out zone.

In seventh examples, for any of the sixth examples an angle between the first and second elements is between 10 degrees and 80 degrees.

In eighth examples, for any of the fourth through seventh examples the structural member comprises plurality of conductive vias angled non-orthogonally to a plane of the package.

In ninth examples, for any of the first through eighth examples a thickness of the structural member is between 10 μm and 70 μm.

In tenth examples, for any of the first through ninth examples the dielectric material comprises a first build-up layer on a first side of the package. A first layer of metal coupled to the die is embedded within the first build-up layer, and the structural member is a first structural member that comprises the metal, and is coplanar with the first layer of metal.

In eleventh examples, for any of the tenth examples the first layer of metal is coupled, through vertical conductive routes, to a second layer of metal embedded within a second build-up material on a second side of the package, the package further comprises a second structural member embedded within the second build-up material, and the first and second structural members comprise elements that are at an angle non-parallel to the vertical conductive routes.

In twelfth examples, for any of the tenth through eleventh examples the keep out zone completely surrounds the perimeter of an IC die and the vertical routes, and the first and second structural members are within the keep out zone and spaced apart from each by a thickness of a package core.

In thirteenth examples, a microelectronic device assembly comprises the IC package of any of the first through tenth examples, and an IC die attached to the package.

In fourteenth examples, for any of the thirteenth examples the IC die is a first IC die and the assembly further comprises a second IC die coupled to the first IC die, and wherein the second IC die is embedded within the dielectric material.

In fifteenth examples, an electronic system comprises a power supply, and a processor die coupled to the power supply, the processor die attached to a package, and the package comprises a dielectric material, and a structural member embedded within the dielectric material, the structural member at least partially around a perimeter of the processor die.

In sixteenth examples, for any of the fifteenth examples the system further comprises a memory die attached to the package, and an interconnect bridge die communicatively coupled to the memory die and to the processor die, the structural member at least partially around a perimeter of the processor die, the memory die, and the interconnect bridge die.

In seventeenth examples, for any of the sixteenth examples the interconnect bridge is embedded within the package.

In eighteenth examples, a method of fabricating an integrated circuit (IC) package, the method comprises applying a resist film to a workpiece surface, forming a first feature within the resist film within a keep out zone of a co-planar one of the metallization level, and depositing a structural material within the feature.

In nineteenth examples, for any of the eighteenth examples the method comprises forming a plurality of second features through the resist film concurrently with forming the first feature, filling the plurality of second features and the first feature with the structural material, removing the resist film, and applying a dielectric material around the structural material.

In twentieth examples, for any of the nineteenth examples the workpiece surface comprises a seed metal, and the filling comprises electroplating copper into the plurality of second features and into the contiguous feature.

In twenty-first examples, for any of the nineteenth examples the plurality of second features are openings having a major axis that is substantially orthogonal to a plane of the workpiece surface, and the first feature comprises a plurality of intersecting openings non-orthogonal to the plane of the workpiece surface.

In twenty-second examples for any of the twenty-first examples forming the plurality of intersecting openings further comprises irradiating the resist film with electromagnetic energy passed through a half-penta prism.

In twenty-third examples, for any of the twenty-second examples the electromagnetic energy is passed through a right angle prism between the workpiece and the half-penta prism.

In twenty-fourth examples, for any of the twenty-third examples, an index matching gel, a mask, and water are between the right angle prism and the surface of the workpiece.

In twenty-fifth examples, for any of the twenty-fourth examples the right-angle prism is between the half-penta prism and the workpiece, and the half-penta prism is separated from the right angle prism by an air gap.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) package, comprising:
   a package core comprising through holes;
   a dielectric material over the package core;
   one or more metallization levels within the dielectric material; and
   a structural member within the dielectric material, the structural member over a perimeter of the package core beyond all of the through holes, and co-planar with at least one of the metallization levels, wherein the structural member comprises a plurality of intersecting elements.

2. The IC package of claim 1, wherein the structural member has a higher elastic modulus than the dielectric material.

3. The IC package of claim 1, wherein the structural member comprises a metal, silicon, or an inorganic dielectric material.

4. The IC package of claim 1, wherein a first and a second of the elements intersect a first distance from a surface of the package, the first of the elements further intersects a third of the elements a second distance from the surface, greater than the first distance and the second of the elements further intersects a fourth of the elements at the second distance from the surface.

5. The IC package of claim 4, wherein the first and second of the elements comprise a first chevron structure or x-beam structure, and the third and fourth of the elements comprise a second chevron structure or x-beam structure, and wherein the structural member comprises a plurality of adjacent chevron or x-beam structures along at least a portion of the perimeter around the through holes.

6. The IC package of claim 5, wherein an angle between the first and second elements is between 10 degrees and 80 degrees.

7. An integrated circuit (IC) package, comprising:
   a package core comprising through holes;
   a dielectric material over the package core;
   one or more metallization levels within the dielectric material; and
   a structural member within the dielectric material, the structural member over a perimeter of the package core beyond all of the through holes, and co-planar with at least one of the metallization levels, wherein the structural member comprises a plurality of conductive features angled non-orthogonally to a plane of the package.

8. The IC package of claim 1, wherein a thickness of the structural member is between 10 µm and 70 µm.

9. The IC package of claim 1, wherein the dielectric material comprises a first build-up layer on a first side of the package, wherein a first of the metallization levels is embedded within the first build-up layer, and wherein the structural member is a first structural member having the same composition as the first of the metallization levels, and is coplanar with the first of the metallization levels.

10. The IC package of claim 9, wherein:
the first of the metallization levels is coupled, through vertical conductive routes, to a second layer of the metallization levels embedded within a second build-up material on a second side of the package;
the package further comprises a second structural member embedded within the second build-up material; and
the first and second structural members comprise elements that are at an angle non-parallel to the vertical conductive routes.

11. The IC package of claim 10, wherein the first structural member completely surrounds the perimeter of an IC die and the vertical conductive routes, and wherein the first and second structural members are spaced apart from each other by a thickness of a package core.

12. A microelectronic device assembly, comprising:
the IC package of claim 1; and
an IC die attached to the package.

13. The assembly of claim 12, wherein the IC die is a first IC die and the assembly further comprises a second IC die coupled to the first IC die, and wherein the second IC die is embedded within the dielectric material.

14. An electronic system, comprising:
a power supply; and
a processor die coupled to the power supply, the processor die attached to the package of claim 1.

15. The electronic system of claim 14, further comprising:
a memory die attached to the package; and
an interconnect bridge die communicatively coupled to the memory die and to the processor die, the structural member at least partially around a perimeter of the processor die, the memory die, and the interconnect bridge die.

16. The electronic system of claim 15, wherein the interconnect bridge is embedded within the package.

17. An integrated circuit (IC) package, comprising:
a dielectric material;
one or more metallization levels within the dielectric material; and
a structural member within the dielectric material, the structural member within a keep-out zone of a co-planar one of the metallization levels, wherein the structural member comprises a plurality of elements that extend in a direction non-orthogonal to a plane of the package.

18. The IC package of claim 17, wherein two or more of the elements intersect at an angle between 10° and 80°.

19. The IC package of claim 17, wherein the structural member comprises a metal, silicon, or an inorganic dielectric material.

* * * * *